United States Patent [19]

Parks

[11] Patent Number: 4,933,987
[45] Date of Patent: Jun. 12, 1990

[54] REMOTE PRESSURE ACTUATED AUDIO CONTROL FOR A VEHICLE SOUND AMPLIFICATION SYSTEM

[76] Inventor: William K. Parks, 323 Obispo Ave. #103, Long Beach, Calif. 90814

[21] Appl. No.: 214,284

[22] Filed: Jul. 1, 1988

Related U.S. Application Data

[63] Continuation-in-part of Ser. No. 40,058, Jun. 10, 1987, abandoned.

[51] Int. Cl.$^5$ .............................................. H03G 3/00
[52] U.S. Cl. ..................................... 455/234; 455/238; 381/107
[58] Field of Search ............... 455/238, 233, 234, 297, 455/345; 330/129, 149, 279; 381/86, 57, 107, 108

[56] References Cited

U.S. PATENT DOCUMENTS

| | | | |
|---|---|---|---|
| 3,079,559 | 2/1963 | Sehy | 455/238 |
| 3,233,109 | 2/1966 | Byles et al. | 455/238 |
| 3,431,498 | 3/1969 | Vareiasian et al. | 455/238 |
| 4,380,824 | 4/1983 | Inoue | 455/238 |
| 4,558,460 | 12/1985 | Tanaka et al. | 455/238 |
| 4,684,899 | 8/1987 | Carpenter | 455/238 |

FOREIGN PATENT DOCUMENTS

| | | | |
|---|---|---|---|
| 2749412 | 2/1979 | Fed. Rep. of Germany | 455/238 |
| 2801734 | 7/1979 | Fed. Rep. of Germany | 455/238 |
| 2826782 | 1/1986 | Fed. Rep. of Germany | 455/238 |

Primary Examiner—Reinhard J. Eisenzopf
Assistant Examiner—Curtis Kuntz
Attorney, Agent, or Firm—Charles H. Thomas

[57] ABSTRACT

An improvement is provided for a radio system for a vehicle, such as an automobile. A pressure sensitive transducer is mounted externally on the body of the vehicle and in a position of exposure to pressure changes resulting from air resistance as the vehicle travels. The speed of a vehicle is directly related to level of ambient noise, such as road noise. The pressure sensitive transducer, provides an electrical output which varies as a function of pressure changes on the transducer. The variable electrical output is coupled either to the electrical preamplifier in the radio receiver which controls the audio volume of the radio, or in circuit to the radio speakers. The audio volume of the radio is thereby increased as the vehicle moves faster, and decreases as the vehicle slows, so as to modulate the audio output of the radio to compensate for ambient noise.

2 Claims, 4 Drawing Sheets

REMOTE PRESSURE ACTUATED AUDIO CONTROL FOR A VEHICLE SOUND AMPLIFICATION SYSTEM

BACKGROUND OF THE INVENTION

The present application is a continuation-in-part of U.S. patent application Ser. No. 040,058 filed on June 10, 1987 now abandoned.

1. Field of the Invention

The present invention relates to an improvement for a radio in a vehicle.

2. Description of the Prior Art

For many years vehicles, such as automobiles, trucks, vans, boats and other vehicles used for passenger transportation, have routinely been provided with radios which may be tuned to commercial broadcasting stations. Typically, automotive vehicle radios are provided which may be tuned to either AM broadcast stations, or both AM and FM broadcast stations.

Radios in an automotive vehicle are provided with a receiver which is mounted in the dashboard of the automotive vehicle. Such a radio includes at least one, and sometimes a plurality of speakers which may either be mounted in the same casing as the receiver, or which may be located elsewhere within the vehicle to produce a stereophonic effect. Such a radio is powered by the direct current voltage supply system which is employed to operate the vehicle.

The audio volume of the radio is normally adjusted by means of a volume control resistor pot which is connected to the volume control input to a volume control preamplifier within the receiver. The volume control resistor pot is normally adjusted by manual manipulation of a rotatable dial. The dial is rotated in one direction to increase the volume of audio output from the speakers, and counter rotated in an opposite direction to reduce the volume of the audio output of the radio speakers.

An individual in the passenger compartment of a vehicle will normally operate the audio volume control dial, while listening to the radio, to adjust the audio output level to a comfortable volume. However, the desired volume of audio output from the radio will vary considerably, depending upon the decibel level of ambient noise. Where the passenger compartment of the vehicle is subjected to a high level of ambient noise an occupant of the vehicle will find it necessary to adjust the volume control to increase the audio output from the speakers so that the audio signal of the station to which the radio is tuned can be heard above the level of ambient noise. On the other hand, where the passenger compartment is subjected to a relative low level of ambient noise, a vehicle occupant will enjoy a much greater level of listening comfort by reducing the volume of the output of the radio.

Various types of automatic radio volume control systems have been devised to attempt to automatically adjust the audio volume of a radio to compensate for ambient background noise. Many such conventional systems require an audio sensor designed to measure the decibel level of background noise, convert the noise level to an electrical signal, compare the electrical signal generated by the background noise with the received signal strength of the broadcast station to which the radio is tuned, and adjust the audio output of the radio accordingly. That is, when a high decibel level of ambient noise is sensed, the strength of the received radio signal from the broadcast station to which the radio is tuned is increased to amplify the received radio signal to produce a louder audio output in an effort to raise that output significantly above the decibel level of the background noise. However, conventional systems of this type are unnecessarily complex and expensive. Moreover, while a relatively constant average decibel level of background noise exists in the environment of the passenger compartment of a vehicle, the instantaneous decibel level of background noise will vary to great extremes. Consequently, conventional systems of the type described tend to increase and reduce the audio volume of the vehicle radio with annoying frequency.

Another type of automatic volume control which has been attempted is a system which adjusts the volume of the output from the radio in accordance with the speed of engine operation. That is, the audio output of the radio speaker system is increased when the revolutions per minute of the engine crankshaft is increased, and decreased when the speed of rotation of the engine crankshaft diminishes. However, this system likewise fails to produce a comfortable level of audio output from a broadcast station, since it addresses only a single component of ambient noise to which the passenger compartment of a vehicle is subjected. Specifically, such a system only compensates for an increased noise level produced by the engine of the vehicle, and fails to compensate for other prominent components of ambient noise, such as the noise of tires on the road, wind noise, and noise produced by vibrations within the vehicle.

SUMMARY OF THE INVENTION

The present invention is an audio level control which is designed for use on vehicles which are typically subjected to variations in ambient noise levels that change with the velocity of operation of the vehicle. The audio output level control system of the invention is connected to either the audio output section or to the audio preamplification section of a sound amplification system in a vehicle. Such a sound amplification system normally includes a receiver which is tunable to a commercial broadcast station frequency. A receiver of this type may be tuned to the audio frequency of AM or FM radio stations, as well as the audio channel of television broadcast stations. However, the invention is equally applicable to a sound amplification receiver which amplifies a signal from an internal source within the vehicle, such as a tape deck or compact disc player.

One principle of operation of the invention is that ambient noise level is likely to increase with the speed of the vehicle. A further principle of operation is that the pressure of air resistance to movement of the vehicle likewise varies as a function of vehicle speed. Accordingly, the system of the invention employs a pressure transducer which is mounted externally on the vehicle and which faces forwardly in the direction of travel of the vehicle. As the vehicle gains speed, air resistance to movement of the vehicle will increase, thereby increasing the relative velocity between the vehicle and the air through which the vehicle moves. This increase in velocity may be conveniently detected as an increase in pressure upon the transducer, although alternative transducer systems may be employed to sense the relative rate of movement of the vehicle through ambient air.

In one broad aspect the present invention may be considered to be an improvement for a sound amplification system of a vehicle comprising a transducer mounted externally on the vehicle and responsive to changes in air resistance to movement of the vehicle through air to provide a variable electrical output, and means coupling the transducer to the sound amplification system to vary the audio output volume thereof as a function of air resistant changes.

In another broad aspect the invention may be considered to be an improvement in a volume control of a sound amplification system within a vehicle. The improvement comprises a transducer for sensing air resistance to movement of the vehicle and for varying an electrical output as a function of that air resistance, and means coupling the transducer to the sound amplification system to provide an electrical outlet thereto to vary the audio output volume thereof as a function of the air resistance.

In still another broad aspect the invention may be considered to be an apparatus for varying the audio output of a sound amplification system in a vehicle comprising a transducer mounted externally on the vehicle and including air resistance sensitive means for sensing air resistance to movement of the vehicle and electrical signaling means for providing an electrical signal proportional to that air resistance, and means coupling the electrical signaling means to the sound amplification system to vary the audio output thereof as a function of the air resistance.

In the preferred embodiment of the invention the transducer is responsive to pneumatic pressure changes resulting from air resistance to movement of the vehicle through ambient air to provide a variable electrical output. The preferred embodiment of the transducer may be mounted in some inconspicuous location in the forward portion of the vehicle where it is exposed to a high velocity of relative movement of air past the vehicle. For example, the transducer may be conveniently mounted on the forward facing surface of a mounting bracket that extends outwardly from the body of the vehicle and carries a rearwardly facing side view mirror. Such side view mirrors are provided as standard equipment on virtually all automotive vehicles on at least the driver's side of the vehicle. If the transducer is located on the forward surface of the rear view mirror mounting bracket, it will not in any way obstruct or interfere with use of the side view mirror, and can be mounted on an existing bracket without requiring a separate mounting.

The operating components of the transducer are carried within a transducer mounting that is secured to the exterior of the vehicle. The transducer also includes a movable element which is carried by the mounting and is movable in longitudinal reciprocation relative thereto along a direction of movement of the vehicle. The preferred transducer also includes air flow resistance means which is exposed to air moving past the mounting as the vehicle moves. The air flow resistance means is operably coupled to the movable element. The transducer also includes a biasing means that urges the movable element toward the direction of vehicle movement relative to the mounting. With this construction increases in air pressure which result from a high rate of relative movement of the vehicle through the atmosphere cause the flow resisting means to press rearwardly on the movable element, thereby overcoming the biasing means, which may take the form of a coil or leaf spring.

The movement of the movable element relative to the transducer mounting may be utilized to vary an electrical output of a variable electrical resistance, such as a conventional slide resistor. A slide resistor employs a wiper connected to one electrical lead. The wiper is operable to slide along the length of a coil of high resistance wire, the leads at the ends of which are maintained at a fixed direct current voltage differential. The wiper serves as a variable electrical biasing input to short circuit a portion of the total resistance of the high resistance electrical wire, depending upon the position of the wiper along the wire.

The coil of high resistance wire forming an electrical resistor extends longitudinally along the direction of movement of the movable element of the transducer and is secured relative to either the transducer mounting or the movable element. The electrical wiper of the variable resistor is secured relative to the other of the transducer mounting and the movable element and is in electrical contact with the high resistance wire. Longitudinal movement of the movable element of the transducer thereby varies the effective resistance of the variable resistor.

The air flow resisting means may take the form of a flexible diaphragm which is disposed to extend transversely across the face of the transducer mounting immediately forwardly of the movable element, which may also be considered to be a piston. A biasing spring urges the movable element or piston toward the flexible diaphragm. Preferably, some means is provided for adjusting the force of the biasing mechanism on the movable element or piston. The diaphragm has a periphery secured to the mounting and a center resiliently deflectable under the force of air resistance of movement of the vehicle to bear against the movable element. A means for longitudinally adjusting the position of the periphery of the diaphragm relative to the mounting is also preferably provided. This adjusting means may thereby be utilized to calibrate the transducer so that the variable electrical output provided from the transducer adjusts the audio output of the vehicle sound amplification system to a volume which is comfortable for listening and which is loud enough to overcome the ambient noise associated with the speed at which the vehicle travels.

The variable electrical output from the transducer may be utilized to remotely and automatically adjust the audio output of the vehicle sound amplification system either at the speakers of the sound system or at the preamplification input in the sound system receiver. When the variable electrical output is derived from a variable resistance, an amplifier controlled by the variable electrical resistance may be coupled in series with a conductor leading from a receiver to a speaker in the sound amplification system. The signal from the receiver is thereby automatically amplified as a function of vehicle speed so that the audio volume from the speaker is loud enough to be heard above ambient noise, but not excessively loud.

Alternatively, the variable electrical resistance may be connected in series in a control input line to an audio preamplifier in the sound amplification system. The control input line to the audio preamplifier in a conventional vehicle sound amplification system is normally connected to an electrical ground through a variable voltage dividing network. The variable electrical resistance of the transducer may be substituted for or added to the conventional variable voltage dividing network in order to modulate the input signal to the preamplifier as a function of the velocity of the vehicle relative to ambient air.

While relative velocity between the vehicle and the surrounding atmosphere may be conveniently sensed by means of a pressure sensing transducer, in the manner hereinbefore described, alternative types of transducers may be employed to sense relative velocity between the vehicle and the surrounding air. For example, a thermally sensitive transducer may be employed instead of a pressure sensitive transducer. In one embodiment of such a system a tubular device is externally mounted on the vehicle and is open at both ends so that air will pass through it at a velocity that varies with the speed of the vehicle vectorially combined with any head winds or following winds. The tubular device is configured to funnel air from an inlet of relatively large diameter into a narrow constriction. The velocity of air through the tube increases at the constriction. The increased air velocity through the constriction increases surface friction and heat generation which can be utilized to control the amplitude of the audio signal.

For example, three resistors of equal value may be positioned in the large diameter inlet area of the tube so that incoming air passes across them. A fourth resistor of the same, equal value is located in the constricted area of the tube. Air rushing past the fourth resistor at the greater velocity than past the other three resistors is heated by increased air friction through the smaller orifice. The resistors may be connected in a differential bridge, such as a wheatstone bridge, to produce a thermally derived electrical output that varies with relative velocity between the vehicle and ambient air.

In still another type of transducer an obstruction is formed in parts. One of the parts is fixed and the other rotates on a hinge. The obstruction is mounted externally to the vehicle As the speed of the vehicle increases through ambient air, the developing air pressure causes the hinged section to open against a spring tension that normally keeps the hinged section closed. A slide portion of a variable slide resistor is attached to the hinged section. The effective resistance of the slide resistor thereby varies in accordance with the difference in force between air on the hinged portion of the obstruction and the opposing force of the spring acting on the hinge.

In a transducer of yet another design an air scoop which operates on the Savonius principle causes a vertical shaft to rotate at a rate determined as a function of vehicle speed. The rotation of the vertical shaft causes weights coupled thereto to be thrust radially outwardly by centrifugal force. The weights are connected to linkage which moves a sleeve upon the vertical shaft. The sleeve, in turn, moved a rack in reciprocation relative to a pinion that in turn rotates and controls an arm that moves the slide on the slide resistor. A spring may be provided to either assist or oppose movement of the sleeve by the weights, and the mechanism can be calibrated by changing the spring, the weights or both.

Yet another type of transducer employs a turbine driven by an impeller which is located in the path of air flow past the vehicle while the vehicle is in motion. The turbine will induce air in a closed chamber to develop pressure therewithin, which will vary as a function of the relative velocity between the vehicle and the surrounding air. A spring loaded resistance opposes the pneumatic pressure within the chamber. As pneumatic pressure within the chamber increases, it overcomes the opposing spring bias and permits a reactor rod to move longitudinally. The motion of the reactor rod controls the slide portion of a slide type variable resistor. The system is calibrated by varying spring tension and/or the length of the reactor rod or by adjusting the vane angles in the turbine. Also, the air gap between a shroud and the turbine can be varied to deflect air away from the turbine to effectuate a further adjustment.

Numerous other types of transducers may be substituted for those described, as long as the transducer produces an electrical output which is proportional to the velocity of the vehicle relative to the surrounding air.

The invention may be described with greater clarity and particularity with reference to the accompanying drawings in which a preferred embodiment of the invention is described.

DESCRIPTION OF THE EMBODIMENTS

Figure 1:
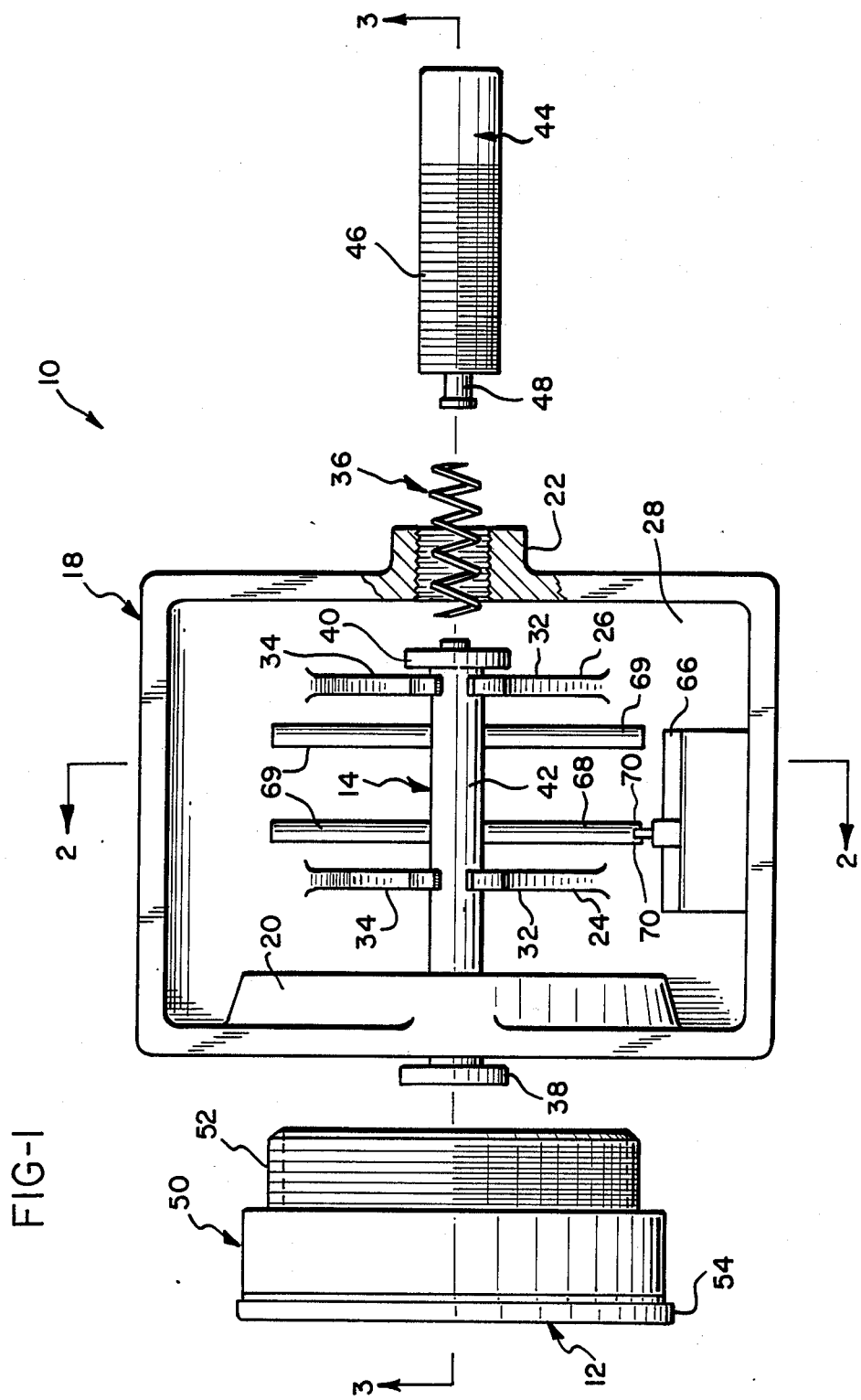
FIG. 1 is an exploded top plan view of a transducer of a preferred embodiment of the invention shown with the lid thereof removed.
Figure 2:
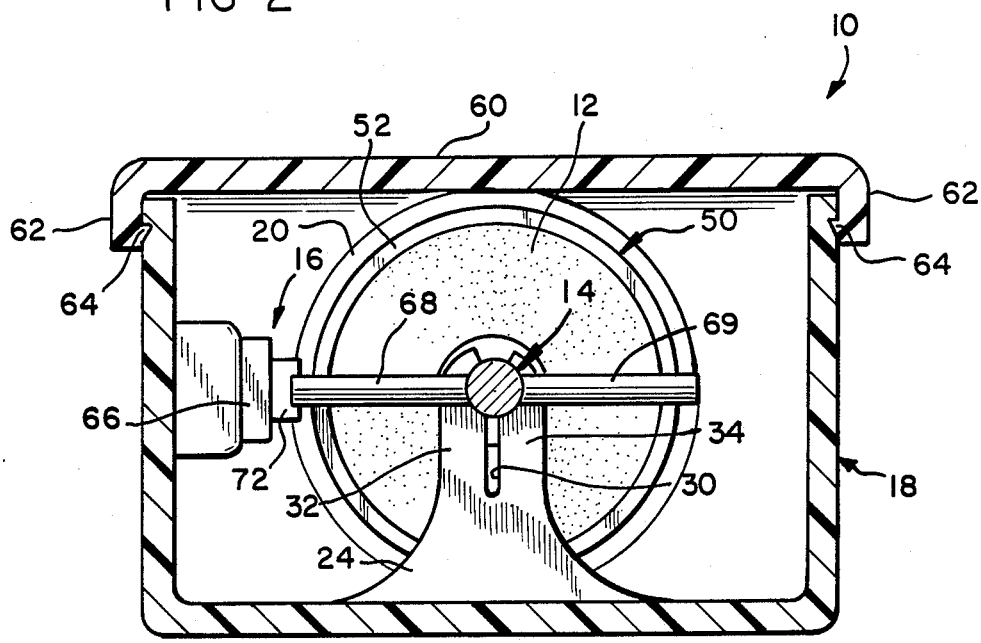
FIG. 2 is a transverse sectional elevational view of the transducer of FIG. 1 taken along the lines 2—2 thereof.
Figure 3:
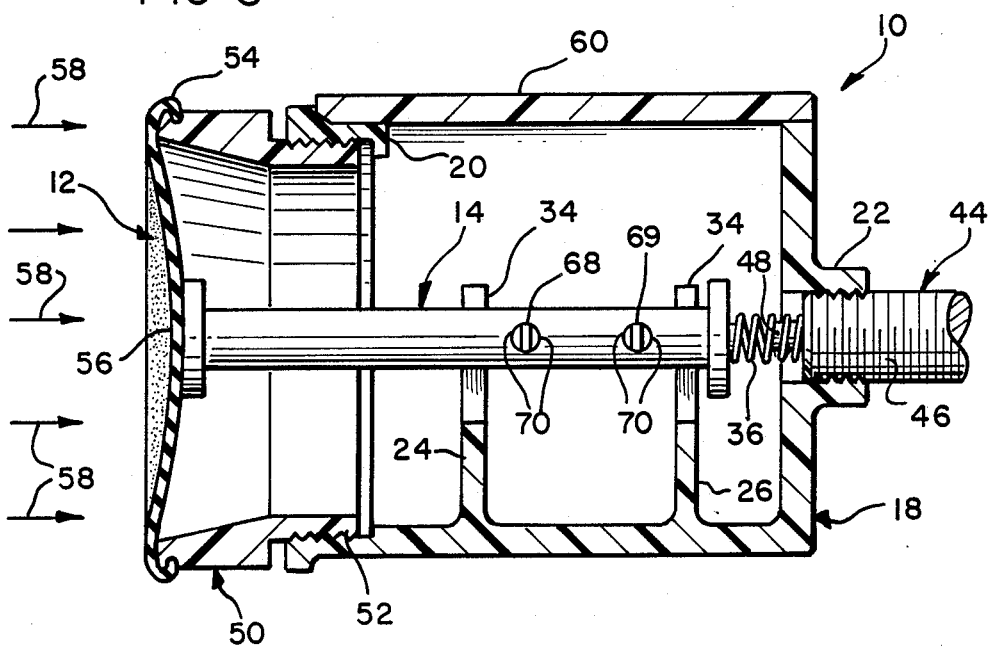
FIG. 3 is a longitudinal sectional elevational view of the transducer of FIG. 1 taken along the lines 3—3 thereof.
Figure 4:
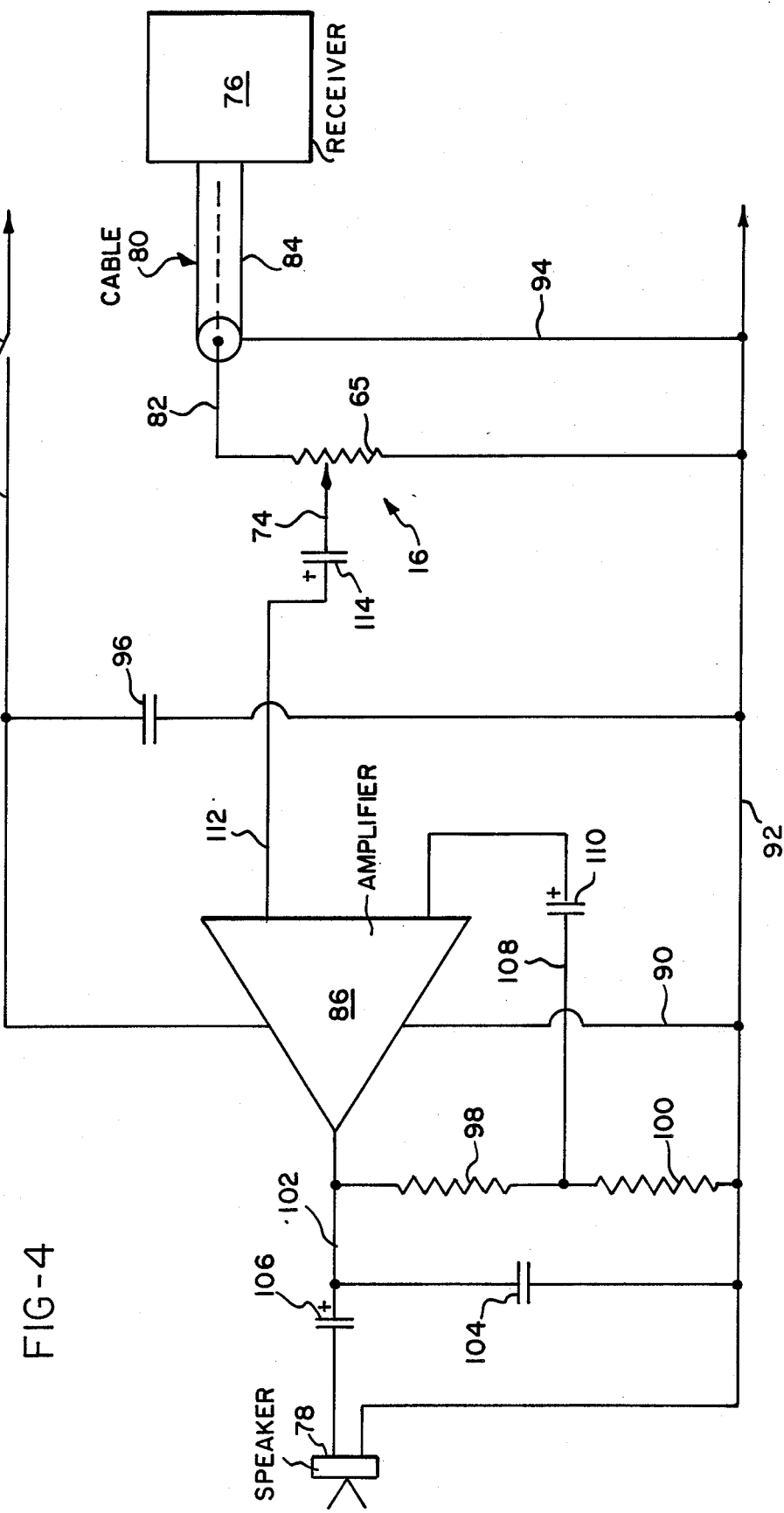
FIG. 4 illustrates electrical circuitry which is coupled to the transducer of FIG. 1 to vary the audio output of a vehicle sound amplification system as a function of air resistance.
Figure 5:
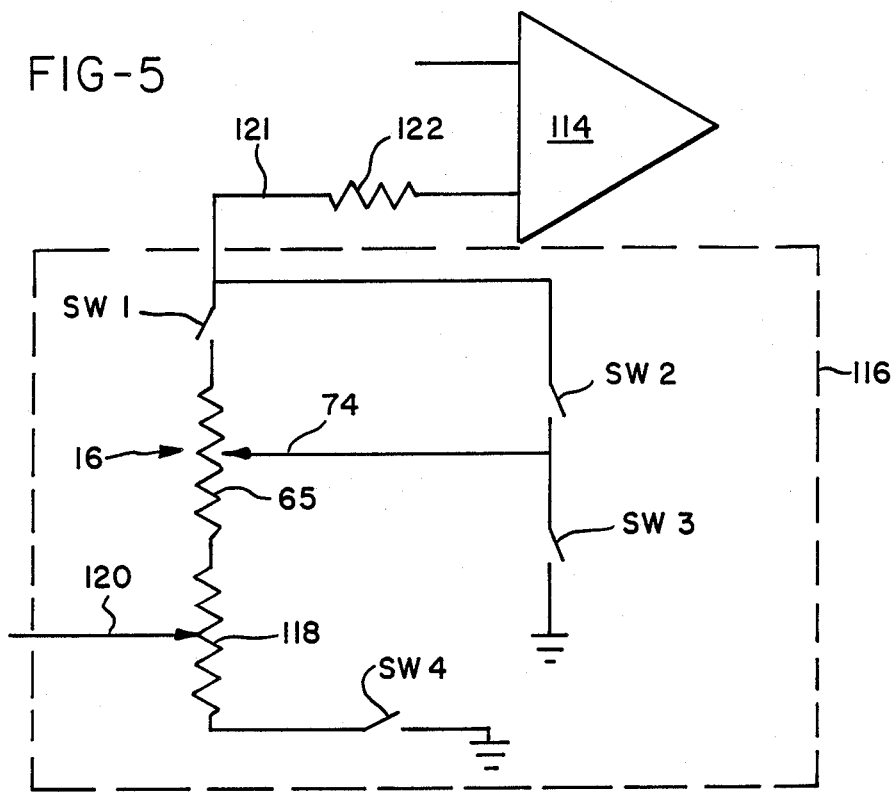
FIG. 5 illustrates an alternative manner of utilization of the output of the transducer of FIG. 1 to vary the audio output of a vehicle sound amplification system.

FIGS. 1, 2 and 3 all depict a transducer 10 which may be connected to either the electrical circuitry of FIG. 4 or that of FIG. 5, to serve as an apparatus for varying the audio output of a sound amplification system in a vehicle. The transducer 10 is mounted externally on an automotive vehicle, such as an automobile, in a position in which the transducer 10 is exposed to the rush of ambient air past the vehicle as the vehicle travels. Preferably, the transducer 10 is mounted at the front of the vehicle or on the forwardly facing surface of the mounting for a rearwardly facing side view mirror on the side of a vehicle, such as an automobile.

The transducer 10 includes air resistance sensitive means in the form of a thin, disc shaped, flexible diaphragm 12 and a generally cylindrical piston 14, which are best depicted together in FIG. 3. Together the diaphragm 12 and piston 14 sense air resistance to movement of the vehicle. The transducer 10 also includes electrical signalling means, in the form of a variable resistance slide type resistor 16, visible in FIGS. 1 and 2. The slide resistor 16 provides an electrical signal proportional to the air resistance between the body of the vehicle and the surrounding ambient air. The electrical circuitry of either FIG. 4 or that of FIG. 5 may be employed as a means for coupling the electrical signalling slide resistor 16 to the sound amplification system of the vehicle to vary the audio output thereof as a function of the air resistance detected by the transducer 10.

The transducer 10 is comprised of a generally boxed shaped transducer mounting 18 having a large, interiorally directed internally threaded annular boss 20 at one end and a much smaller internally threaded exteriorally directed annular boss 22 at the opposite end in coaxial alignment with the boss 20. A pair of piston mounting pedestals 24 and 26 are molded as a part of the structure of the mounting 18. The pedestals 24 and 26 rise from the floor 28 of the mounting 18 and define keyholed shaped, longitudinally aligned slots 30 which are adapted to receive the generally cylindrical piston 14 in longitudinal, sliding engagement therewithin. The elongated portion of the slot 30 separates a pair of upstanding arms 32 and 34 on each of the pedestals 24 and 26 so that the piston 14 is cradled between the arms 32 and 34 and is longitudinally aligned along the direction of movement of the vehicle and is longitudinally reciprocal relative to the transducer mounting 18. The piston 14 is carried between the arms 32 and 24 in coaxial alignment between the bosses 20 and 22.

The piston 14 is an elongated generally cylindrical structure, preferably formed of plastic and having transverse bearing discs 38 and 40 formed at the opposite ends of its cylindrical shank 42. The biasing spring 36 is compressed between a plastic cylindrical end plug 44 and the bearing plate 40 of the piston 14. The end plug 44 is a solid, cylindrical structure which is externally threaded on the forward portion of its outer surface, as indicated at 46, and which has a centering post 48 of reduced diameter at its forward end facing the bearing plate 40 of the piston 14. The plug 44 is threadably engaged within the annular boss 22 at the rear of the mounting 18.

The magnitude of force of the forward bias of the spring 36 on the piston 14 may be adjusted by threadably advancing or withdrawing the plug 44 relative to the boss 22. By advancing the plug 44 to the left within the boss 22, as viewed in FIG. 3, the biasing force of the spring 36 upon the piston 14 may be increased. Conversely, by partially unscrewing the plug 44 relative to the boss 22 so that the plug 44 moves to the right, as viewed in FIGS. 1 and 3, the biasing force exerted by the spring 36 upon the piston 14 may be reduced. The plug 44, together with the threaded boss 22, thereby serves as a means for adjusting the force of the biasing spring 36 on the movable element of the transducer 10, which is the piston 14.

At the forward end of the transducer 10 there is an annular, molded plastic collar 50 which has a rearwardly extending threaded portion 52 that is threadably engaged with the internal threads of the inwardly directed annular boss 20 at the forward end of the transducer mounting 18. The mouth of the collar 50 is closed by the generally disc shaped neoprene diaphragm 12, the peripheral margin 54 of which is seated in a radially outwardly facing annular groove in the collar 50. The diaphragm periphery 54 is thereby secured relative to the transducer mounting 18 by means of the collar 50.

By threadably advancing or withdrawing the threaded portion 52 of the collar 50 relative to the boss 20, a means is provided for longitudinally adjusting the position of the periphery 54 of the diaphragm 12 relative to the mounting 18. That is, by screwing the threaded portion 52 of the collar 50 further into the boss 20 the collar 50 is moved to the right, as viewed in FIGS. 1 and 3, to thereby bring the diaphragm 12 closer to the bearing plate 38 of the piston 14. Conversely, by unscrewing the threaded portion 52 of the collar 50 relative to boss 20, the collar 50 and peripheral margin 54 of the diaphragm 12 are carried to the left, as viewed in FIGS. 1 and 3, thereby increasing the separation between the diaphragm 12 and the forward bearing plate 38 of the piston 14. The closer the position of the diaphragm periphery 54 to longitudinal alignment with the bearing plate 38, the greater will be the influence of deflection of the center 56 of the diaphragm 12 upon the electrical output of the transducer 10.

As illustrated in FIG. 3, the center 56 of the diaphragm 12 is resiliently deflectable under the force of air resistance to movement of the vehicle. The vector force of this air resistance is indicated by directional arrows 58 in FIG. 3. When the center 56 of the diaphragm 12 is subjected to a sufficient force 58, it will contact and bear against the movable piston 14, thus acting in opposition to the spring 36, as depicted in FIG. 3.

The transducer mounting 18 is closed by a lid 60, visible in FIGS. 2 and 3. The lid 60 is provided with a pair of parallel, overhanging lips 62 having inwardly directed, parallel latching teeth 64, as illustrated in FIG. 2. The teeth 64 seat in registration in corresponding crevices near the upper edges of the side walls of the mounting 18, so that the lid 60 can snap onto the mounting 18, with the teeth 64 thereof engaged in the crevices to keep the top of the transducer 10 closed. The housing 18 and the lid 60 thereof define an enclosed chamber which is isolated from air rushing past the transducer 10, although the force 58 of air resistance does act upon the diaphragm 12 and the piston 14, as will hereinafter be described. It is preferable, however, for the transducer 10 to define an enclosed chamber within which the operative components thereof are mounted, to protect the operative components from dirt and moisture and to keep them in smoothly functioning working order.

The slide resistor 16 of the transducer 10 is formed of a length of high resistance wire 65 helically wound about a support 66 which extends longitudinally parallel to the direction of vehicle movement and parallel to the piston 14 in spaced separation therefrom, as depicted in FIGS. 1 and 2. The piston 14 is provided with a plurality of radial arms 68 and 69 each of which terminates in a pair of fingers 70, as depicted in FIG. 1, the fingers 70 of the arm 68 longitudinally embrace the inwardly directed slide lever 72 of the slide switch 16. The slide lever 72 controls the position of the slide resistor wiper 74 along the length of the helically wound high resistance wire 65 so that electrical current passing through the slide resistor 16 encounters an electrical resistance which varies with the position of the movable piston 14 relative to the transducer mounting 18. The electrical current through the slide resistor 16 thereby serves as the variable electrical output from the transducer 10. The variable electrical output of the transducer 10 is employed to vary the audio output volume of a sound amplification system of a vehicle as a function of air resistance changes encountered by the vehicle in moving through ambient air.

FIG. 4 illustrates, schematically, an audio amplification sound system for a vehicle which includes a conventional receiver, indicated generally at 76 in FIG. 4, and at least one 4 ohm speaker, indicated at 78. A shielded cable 80, having a center conductor 82 and a braided ground sleeve connection 84, serves as an electrical conducting means which connects the receiver 76 to the speaker 78.

In the embodiment of FIG. 4 an audio amplifier 86 is located on a circuit board that is physically located proximate to the speaker 78. The amplifier 86 may be an LM 383 integrated circuit chip supplied with positive 12 volt direct current power on line 88 and having a ground connection through lines 90 and 92. The power connections on lines 88 and 92 may be connected into the electrical wiring of the vehicle, or they may derive power from a plug which may be inserted into a cigarette lighter socket of the type provided as standard equipment of most automotive vehicles. A switch 89 is provided to enable and disable operation of the amplifier 86.

A ground connection 94 extends between the braided shield 84 of the shielded cable 80 and the ground lead 92. A 0.22 microfarad capacitor 96 is connected as an AC filter across lines 88 and 92. At the output of the amplifier 86 there is a voltage dividing circuit including a 100 ohm resistor 98 and a 10 ohm resistor 100 coupled in series with each other between the amplifier output line 102 and the ground end 92. Another 0.22 microfarad capacitor 104 is coupled as an AC filter across lines 102 and 92. The output lead 102 from the amplifier 86 is connected to the speaker 78 through a 2200 microfarad capacitor 106. A center tap between the resistors 98 and 100 is fed on line 108 through a 470 microfarad capacitor 110 as one input to the amplifier 86.

The other input to the amplifier 86 is derived from the slide resistor 16 on line 112 through a 10 microfarad capacitor 114. As depicted in FIG. 4, the variable resistance of the slide resistor 16 is connected in series with the shielded cable 80 between the receiver 76 and the speaker 78 to vary the amplitude of modulation of the audio output of the speaker 78 through the input 112 to amplifier 86. The strength of the signal output of the amplifier 86 on line 102 will change according to the position of the piston 14 in its travel relative to the transducer mounting 18. That is, when the wind force 58 forces the center 56 of the diaphragm 12 inwardly toward the center of the transducer mounting 18, as depicted in FIG. 3, the piston 14 will be forced toward the rear of the transducer housing 18, overcoming the bias of the spring 36.

The arm 68 of the piston 14 carries the slide 72 thereby moving the wiper 74 along the resistor 65 of the slide resistor 16 to reduce the series resistance between the shielded cable 80 and the speaker amplifier 86. As a result, the signal on line 112 is stronger, thereby producing a higher audio output from the amplifier 86 and the speaker 78. Conversely, when the air resistance against the diaphragm 12 is reduced, the spring 36 will urge the piston 14 forwardly and away from the plug 44. The arm 68 of the piston 14 thereby carries the slide 72 of the slide resistor 16 along the length of the resistor wire 65 to increase the effective resistance which is placed in series between the lines 82 and 112. This reduces the signal strength on line 112, thereby reducing the amplitude of the output of the amplifier 86. As a result, the audio volume of the output of the speaker 78 is diminished.

FIG. 5 illustrates an alternative manner in which the audio output of a vehicle sound amplification system may be controlled as a function of velocity of relative movement of the vehicle through ambient air. FIG. 5 illustrates a portion of a conventional receiver for a vehicle sound amplification system having a volume control preamplifier 114 therein. Typical vehicle receivers having amplifiers 114 are described in schematic drawings for automotive vehicle radios which are published by Sam's Electronic. For example, the volume control preamplifier 114, depicted in FIG. 5, may be the preamplifier indicated at DM-97 in Sam's 1980 schematic AR-535 for the Delco 1982 radio series. The preamplifier 114 of FIG. 5 may also correspond to the right speaker volume amplifier U5 or the left speaker volume amplifier U6 of automotive radios for General Motors automotive vehicles, the schematics for which are published by Sam's Electronics as number AR 339. The modification of FIG. 5 may be applied to numerous other automotive vehicle radios as well.

In the circuitry of FIG. 5 the receiver is provided with a manual volume control input to the preamplifier 114. For example, in the Sam's schematic AR 535 this manual volume control is a variable resistor identified as R1A which is coupled by line 515 as a driving input to the volume control amplifier DM-97, which may be the amplifier 114 in the circuitry of FIG. 5. Similarly, the manual volume control input to the amplifiers U5 and U6 in the Sam's schematic AR 339 are identified as R1D and R1C, respectively. In all instances these manual volume controls take the form of a variable resistor pot which is manipulated by a dial on the face of the receiver.

In the modification of FIG. 5 the manual volume control resistor provided as original equipment with the receiver is removed and is replaced with the circuitry indicated generally at 116. Within the circuitry 116 the variable resistor pot 118 is substituted for the resistor pot provided for the manual volume control of the receiver as designed. The total resistance of resistors 118 and the entire length of the resistance wire 65 in the slide resistor 16 is equal to the maximum resistance of the resistance pot of the volume control resistor supplied as original equipment. The wiper 120 of the resistor 118 is manipulated by the volume control dial of the receiver, as supplied by the manufacturer.

The volume control resistor 118 is connected to the variable slide resistor 16, previously described, and the slide resistor 16 is connected to control input line 121 to the preamplifier 114 through a dropping resistor 122 and through a relay operated switch contact SW1. In a parallel circuit the wiper 74 of the slide resistor 16 is connected to control input line 121 through a second relay operated contact switch SW2. The wiper 74 is also connected to ground through a third relay switch SW3.

In the modified receiver amplification circuitry of FIG. 5, the volume control line 120 leading to the volume control preamplifier 114 may be connected to the substitute manual volume control resistor pot 118 and operated in the conventional manner. When a user wishes to operate the manual volume control of a vehicle sound amplification system in a conventional manner without using the remote volume control apparatus of the invention, a conventional relay (not shown) is employed to maintain the switches SW1, SW2, SW3 and SW4 in a deactuated condition. In this condition switches SW1 and SW4 are closed and switches SW2 and SW3 are open. The wiper 120 of the volume control resistor 118 may then be adjusted by the volume control dial in the conventional fashion.

However, when the control to utilize the invention is to be operated in the automatic mode to utilize the invention, the relay is operated to open switches SW1 and SW4 close switches SW2 and SW3. The variable electrical output of the transducer 10 is thereupon connected to the volume control input 121 to the preamplifier 114. As the speed of the vehicle increases, increased pressure will resiliently deflect the diaphragm 56 of the transducer 10 to move the piston 14. This will result in movement of the wiper 74 of the slide resistor 16 to decrease the effective resistance of the resistance wire 65. That is, a greater portion of the resistance wire 65 is shorted to ground through switch SW3 as pressure on the diaphragm 12 increases. Conversely, when pressure on the diaphragm 12 diminishes, the wiper 74 moves in the opposite direction to bring a greater portion of the resistance of the wire 65 back into the circuit connection of control input line 121 to ground through the wiper 64 and through switch SW3.

Undoubtedly, numerous variations and modifications of the invention will become readily apparent to those familiar with vehicle sound amplification system controls. Accordingly, the scope of the invention should not be construed as limited to the specific embodiment depicted and described, but rather is defined in the claims appended hereto.

I claim:

1. Apparatus for varying an audio output of a sound amplification system in a vehicle comprising:

a transducer mounted externally on said vehicle and including air resistance sensitive means for sensing air resistance to movement of said vehicle, including a transducer mounting secured on the exterior of said vehicle, a piston longitudinally aligned along the direction of movement of said vehicle and longitudinally reciprocal relative to said transducer mounting, biasing means urging said piston in said direction of vehicle movement, and air flow resistance means engageable with said piston and mounted to extend transversely to said direction of movement, and an electrical signalling means for providing an electrical signal proportional to said air resistance and including an electrical resistor extending longitudinally along said direction of movement, and secured relative to one of said transducer mounting and said piston, and an electrical wiper secured relative to the other of said transducer mounting and said piston in contact with said electrical resistor, whereby the effective resistance of said resistor varies in response to reciprocal movement of said piston relative to said transducer mounting, and means coupling said electrical signalling means to said sound amplification system to vary the audio output thereof as a function of said air resistance.

2. Apparatus according to claim 1 wherein said biasing means is a spring.

* * * * *